ELECTRICAL TUNING DEVICE

Filed Oct. 10, 1952

2 Sheets-Sheet 1

INVENTORS
CLIFFORD D. NESTLERODE
DAVID C. FELT
BY
Darby & Darby
ATTORNEYS

Oct. 1, 1957

C. D. NESTLERODE ET AL

ELECTRICAL TUNING DEVICE 2,808,515

Filed Oct. 10, 1952

2 Sheets-Sheet 2

INVENTORS
CLIFFORD D. NESTLERODE
DAVID C. FELT
BY
Darby & Darby
ATTORNEYS

United States Patent Office 2,808,515

Patented Oct. 1, 1957

2,808,515

ELECTRICAL TUNING DEVICE

Clifford D. Nestlerode, Packanack Lake, and David C. Felt, Teaneck, N. J., assignors to Allen B. Du Mont Laboratories, Inc., Clifton, N. J., a corporation of Delaware Application October 10, 1952, Serial No. 314,188

3 Claims. (Cl. 250—40)

The present invention relates to electrical tuning devices and particularly to a novel construction for selectively converting radio signals of any one of a plurality of frequencies to a standard intermediate frequency.

More particularly still the invention relates to a tuning device of the type described which is adjustable to tune a wide range of frequencies including the frequencies of all of the 82 presently allocated television channels.

Electrical tuning devices of the general type above described have been constructed, but these devices were limited to the tuning of a small number of frequencies and were not adapted to have their range extended without becoming electrically inefficient and physically so increased in size as to be substantially unusable.

The present invention comprises two drums or sleeves mounted coaxially on an axis. One of these drums, referred to hereinafter as a circuit drum, has a plurality of sets of circuits or coils fastened to the inner surface of the drum, the coils being arranged in sets, each set being circumferentially spaced from every other set and the coils of each set being arranged longitudinally along the surface of the drum. Suitable terminal pins extend through the drum and are electrically connected to the coil ends.

An electric circuit unit is suitably positioned with respect to the circuit drum, this unit having fixed contact members thereon adapted to make contact with all of the connector pins of a given set of coils simultaneously, the circuit being mounted in a fixed position so that as the drum is rotated the various sets of coils are connected to the stationary circuit unit.

The inner drum or sleeve, which will be referred to hereinafter as the tuning drum, has a plurality of electrically conductive tuning or shading elements fixed to its outer surface. These elements are arranged in a manner similar to the arrangement of the coils on the circuit drum, that is, there are a number of sets of tuning elements, the sets being spaced circumferentially about the drum and the individual elements of each set being arranged along longitudinal lines on the drum surface. The coils are arranged on the inner surface of the circuit drum, and the tuning elements on the outer surface of the tuning drum, with the result that the tuning elements are spaced only slightly from the coils, thereby providing a means for modifying the resonant frequency of the circuit in which the tuning device is connected.

In the preferred form of the invention the circuit drum and tuning drum are mounted on the same shaft, the tuning drum being rotatable with respect to that shaft while the circuit drum is fixed on the shaft. This arrangement provides a means for rotating the two drums in unison for locating the connector pins with respect to the circuit unit, the tuning drum then being frictionally driven, and also provides for adjustment of the tuning drum with respect to the circuit drum in any given position of the circuit drum.

As will appear hereinafter, suitable scales and indicators are provided so that the position of the two drums may be apparent.

It is an object of the invention to provide an electrical tuning device for selectively converting radio frequency signals to intermediate frequency signals, the tuning device being capable of selecting one from a wide range of frequencies.

It is a further object of the invention to provide such a tuning device which is electrically efficient and physically compact.

It is another object of the invention to provide a device of the class described which, due to the relatively large surface areas of the drums, may be precisely manufactured and therefore achieves improved stability in operation.

Other objects and features of the invention will be apparent when the following description is considered in connection with the annexed drawings, in which, Figure 1 is a front elevation of a tuning device in accordance with the invention;

Figure 4:
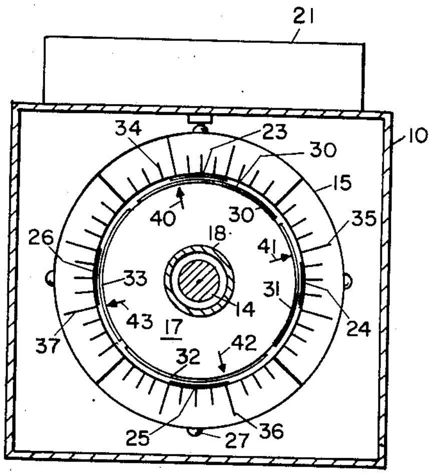
Figure 4 is a vertical cross-sectional view of the device of Figure 1, the view being taken on the plane of the line 4—4 of Figure 3.
Figure 1:
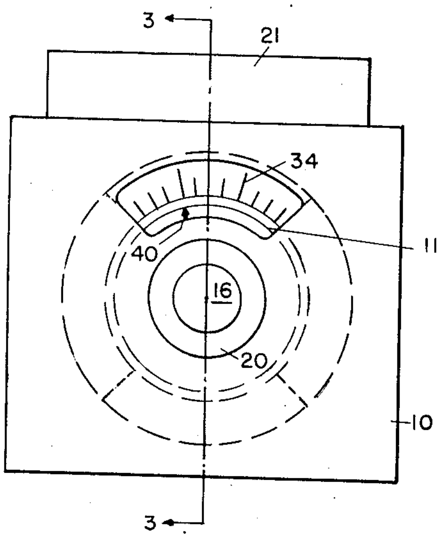
Figure 2:
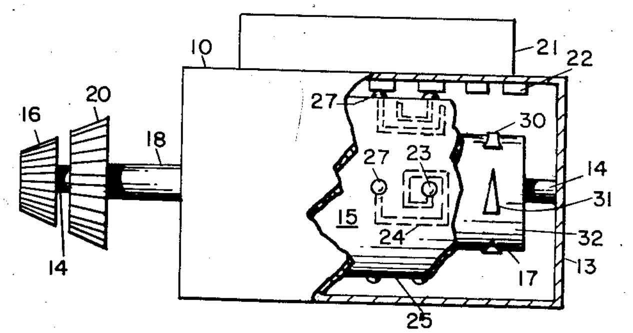
Figure 2 is a side elevation of the device of Figure 1, the housing being broken away to show the circuit drum and that drum in turn being broken away to show the tuning drum.

Referring now to the drawings, the tuning device comprises a housing 10 which has the shape of a square box and is provided in its forward side with a window or opening 11. Mounted centrally of the box 10 and supported in the two end plates 12 and 13 thereof is a shaft 14. Fixedly mounted on the shaft 14 is the outer circuit drum 15 as well as the control knob 16. Rotatably mounted upon the shaft 14 is the inner tuning drum 17. Drum 17 has a sleeve-like member 18 fixed thereto which extends forwardly through the end plate 12 of the housing 10 and has fastened to it at its outer end a control knob 20.

Fixedly positioned on the housing 10 is a control unit 21 which may comprise a number of electrical circuits such as a tuned radio frequency circuit, an oscillator circuit and a mixer circuit of the types normally used in television or radio receivers. The circuit elements above-mentioned are well known in the art and are not shown in the drawing. Contacts 22 are mounted on the circuit unit 21 and extend through the housing 10 and into position to make contact with connector pins extending through the circuit drum in a manner about to be described.

Mounted on the inner surface of the circuit drum are a plurality of sets of coils indicated at 23, 24, 25 and 26. These coils may comprise a number of turns of conductor or a single turn or in some instances a fraction of a turn. Furthermore, they may have gaps therein to supply capacity effects and may in general be of any suitable configuration to accomplish the proper tuning of the circuits in which they are connected. The coils may consist of conductors wound into the desired configuration and attached rigidly to the inner surface of the drum or these coils may be printed or stamped on the inner surface of the drum either before or after the backing sheet on which the circuit units are printed or stamped is fabricated into its final drum form. The connector pins 27 extend through the drum and into contact with the coil ends. The outer ends of the pins 27 are suitably formed and act as contacts cooperating with the contacts 22 of the circuit unit 21.

Fixed to the outer surface of the inner or tuning drum 17 are a plurality of sets of tuning elements designated 30, 31, 32, 33. These tuning elements comprise electrically conductive members and are arranged in sets corresponding to the arrangement of the coils 23, 24, 25 and 26. The tuning or shading elements may be triangular in shape with their longer dimension extending circumferentially of the tuning drum. Instead of being tapered in the manner indicated the tuning elements 30–33 may be generally rectangular and of tapering thickness or may be of uniform thickness with the surfaces spaced from the frequency determining elements by varied amounts. They thus serve to select a particular frequency from the wider range of frequencies selected by the positioning of the outer circuit drum.

Figure 3:
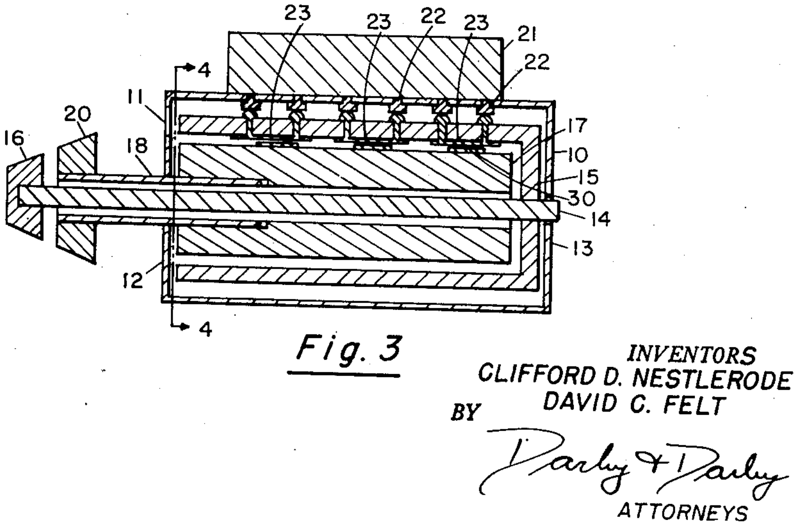
Figure 3 is a vertical cross-sectional view of the device of Figure 1, the view being taken on the plane of the line 3—3 of Figure 1.

As will be readily seen by reference to Figure 3, when the control knob 16 is rotated it carries with it the outer drum 15 and causes a set of connector pins such as 27 associated, for example, with the coils 23 to move out of contact with contacts 22 and causes a second set such for example as the pins of the set associated with coils 24 to move into contact with the contacts 22. Due to a frictional connection between sleeve 18 and the shaft 14 the inner drum 17 rotates with the outer drum 15. Selection of a particular frequency within the band is then made by rotating the knob 20 while retaining the knob 16 in its then position until the desired frequency is indicated. In order that there may be a physical indication of the rotative position of the tuning elements, a plurality of scales 34, 35, 36 and 37 are fastened on the forward rim of the drum or sleeve 15 and a corresponding plurality of pointers 40, 41, 42 and 43 are fastened on the forward rim of the tuning drum 17; or, if desired, may be fixed to the periphery of the drum 17 and extend outwardly lying forwardly of the scales 34, 35, 36 and 37. Of course, the number of scales and indicators or pointers corresponds to the number of sets of coils and to the number of sets of tuning elements, and the scales are suitably marked to indicate the particular frequency which is selected when the drums are positioned as indicated. This marking may, for example, be one of numbers corresponding to the numerical designation of the various television channels.

Figure 5:
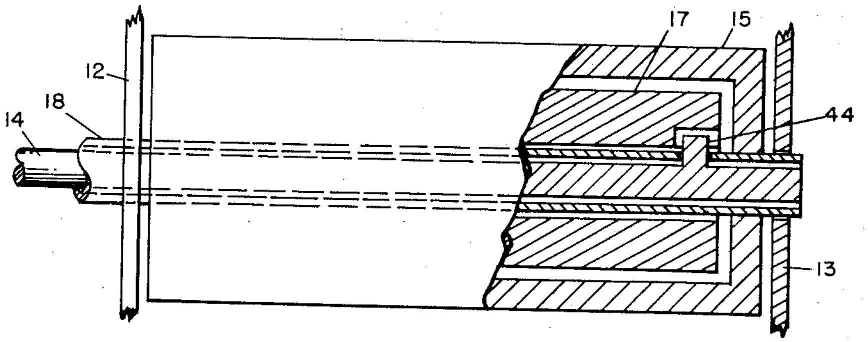
Figure 5 is a side elevation partially in longitudinal cross-section showing an illustrative mode of connecting the circuit and tuning drum to the supporting shaft.

Referring to Figure 5 there is shown therein a modification of the arrangement heretofore described. In this instance, the sleeve 18 is supported in both the front and rear plates 12 and 13 of the housing 10 and the shaft 14 is supported in the sleeve, and the outer circuit drum 15 is fixedly connected to the sleeve 18 and the inner tuning drum 17 is rotatably mounted on sleeve 18. A projection 44 is provided on the shaft 14, this projection extending through a slot in the sleeve 18 and resting in a short splined portion of the inner circumference of the drum 17. The slot in the sleeve 18 has an angular extent equal to the angle between sets of coils 23, 24, 25 and 26. By this arrangement when the sleeve 18 is rotated it will carry the outer circuit drum 15 with it and after a rotation equivalent to the angle between coil sets will also carry the inner drum 17. Once the outer drum has been positioned, the inner drum may then be adjusted within the limited range by means of the shaft 14 and the operating knob thereof. In the particular instance illustrated there are provided four sets of coils and four sets of tuning elements and therefore the angular extent of the slot in the sleeve 18 is 90°.

While we have described preferred embodiments of our invention it will be understood that many other modifications may be made without deviating from the principles thereof; therefore we wish to be limited not by the foregoing description but solely by the claims granted to us.

What is claimed is:

1. An ultra high frequency electrical tuning device comprising a stationary electrical circuit unit, a pair of insulative drums positioned one within the other on a common axis, the adjacent longitudinal surfaces of said drums being separated slightly from each other, a plurality of frequency determining elements on the inner longitudinal surface of the outer one of said drums, first means for rotating said outer one of said drums for selectively electrically engaging said elements with circuits of said stationary electrical circuit unit at a predetermined rotary position of said outer drum, and a corresponding plurality of electrically conductive tuning elements on the outer longitudinal surface of the inner one of said drums, second means for rotating said inner one of said drums, said first means being concentric within said second means, said tuning elements corresponding to respective ones of said frequency determining elements and being adapted to modify the tuning effect thereof when said inner drum is rotated.

2. The device in accordance with claim 1, including a scale indicia positioned on the circumference of said outer drum and an indicator positioned on the circumference of said inner drum to move with respect to said indicia when said drums are relatively rotated.

3. An ultra high frequency electrical tuning device comprising a stationary electrical circuit unit, a circuit drum rotatably mounted with its longitudinal surface in close proximity to said circuit unit, a plurality of sets of frequency determining elements positioned circumferentially on the inner longitudinal surface of said drum and angularly equally spaced, the elements of each set being mounted in lines along the drum and extending parallel to the drum axis, connector members electrically connected to said frequency determining elements, means to rotate said drum about its axis, stationary contacts on said circuit unit adapted to engage selectively said connector members in different rotative positions of said drum, a tuning drum mounted on the axis of said circuit drum, the outer surface of said tuning drum being spaced slightly from the inner surface of said circuit drum, means to rotate said tuning drum about said axis and a plurality of sets of electrically conductive tuning elements mounted on said tuning drum outer surface, each said tuning element set being circumferentially spaced from every other set in correspondence to the positioning of said frequency determining elements on said circuit drum, the elements of each set extending in lines parallel to the drum axis corresponding to the positioning of the frequency determining elements of a set.

References Cited in the file of this patent

UNITED STATES PATENTS

| | | |
|---|---|---|
| 2,297,889 | Hoffmann et al. | Oct. 6, 1942 |
| 2,385,131 | Garthwaite | Sept. 18, 1945 |
| 2,513,392 | Aust | July 4, 1950 |
| 2,600,119 | Lazzery | June 10, 1952 |
| 2,643,361 | Mackey | June 23, 1953 |

FOREIGN PATENTS

| | | |
|---|---|---|
| 541,150 | Germany | Jan. 9, 1932 |